(12) United States Patent
Momtaz

(10) Patent No.: US 7,956,645 B2
(45) Date of Patent: Jun. 7, 2011

(54) LOW POWER HIGH-SPEED OUTPUT DRIVER

(75) Inventor: Afshin Momtaz, Laguna Hills, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 12/049,701

(22) Filed: Mar. 17, 2008

(65) Prior Publication Data
US 2009/0230993 A1    Sep. 17, 2009

(51) Int. Cl.
*H03K 19/094*  (2006.01)
(52) U.S. Cl. ............ 326/86; 326/83; 326/113; 327/112; 327/108
(58) Field of Classification Search ............ 326/83, 326/86–87, 112, 115, 127, 26, 27, 33, 80, 326/81; 327/65, 362, 108–112, 379, 389, 327/391, 333, 66, 67
See application file for complete search history.

(56) References Cited

U.S. PATENT DOCUMENTS

| | | | | |
|---|---|---|---|---|
| 5,977,796 | A * | 11/1999 | Gabara | 326/86 |
| 6,281,715 | B1 * | 8/2001 | DeClue et al. | 327/65 |
| 6,313,662 | B1 * | 11/2001 | Ide | 326/83 |
| 6,617,881 | B2 * | 9/2003 | Uchiki et al. | 326/86 |
| 6,853,220 | B2 * | 2/2005 | De Laurentiis et al. | 327/108 |
| 6,977,534 | B2 * | 12/2005 | Radelinow | 327/112 |
| 7,183,805 | B2 * | 2/2007 | Wang et al. | 326/86 |
| 7,256,624 | B2 * | 8/2007 | Cheng et al. | 327/112 |
| 7,362,146 | B2 * | 4/2008 | Macaluso | 327/108 |
| 7,383,373 | B1 * | 6/2008 | Strickland | 710/315 |
| 7,443,211 | B2 * | 10/2008 | Liu | 327/108 |
| 7,538,588 | B2 * | 5/2009 | Liu et al. | 327/108 |
| 7,696,787 | B2 * | 4/2010 | De Araujo et al. | 326/86 |

* cited by examiner

*Primary Examiner* — James H. Cho
*Assistant Examiner* — Christopher Lo
(74) *Attorney, Agent, or Firm* — Garlick & Harrison & Markison; Shayne X. Short

(57) ABSTRACT

Low power high-speed output driver. An array of switches (some of which are inverting switches whose connectivity is governed oppositely as the control signal provided to it) is implemented such that an input signal governs the connectivity of those switches. A resistor is coupled between the nodes interposed between the switches of the array, and an output signal is taken from the nodes at ends of the resistor. The high voltage level of such an output driver is truly the level of the power supply energizing the circuit (e.g., VDD) while still consuming relatively low power.

20 Claims, 8 Drawing Sheets

LOW POWER HIGH-SPEED OUTPUT DRIVER

BACKGROUND OF THE INVENTION

1. Technical Field of the Invention

The invention relates generally to communication systems; and, more particularly, it relates to output driver circuitry within such communication systems.

2. Description of Related Art

Data communication systems have been under continual development for many years. Within such communication systems, there are often interfaces between communication devices, integrated circuits, boards, and/or other elements therein. Sometimes, a last element (e.g., in an integrated circuit) that outputs a signal to be transmitted to another element (e.g., to another integrated circuit via a printed circuit board) is referred to as an output driver. Sometimes, such output drivers need to deliver slightly more current than other elements within the integrated circuit (such as those that only communicate between various elements within the integrated circuit).

FIG. 2 illustrates an embodiment of a prior art common mode logic (CML) output driver 200. A conventional/prior art high speed output driver generally has a CML structure that includes a differential pair of transistors similar as shown in this diagram. Within such a prior art CML output driver 200, a pre-driver is typically also employed to drive the input differential signal, in/inb, before being provided to the CML structure shown that includes the two 50Ω load resistors coupled between the drains of the differential pair of transistors and VDD and the current supply providing the current Io to the coupled sources of the differential pair of transistors. It is noted, however, that the load impedances of the pre-driver need not necessarily be two 50Ω load resistors, and the current supply of the pre-driver need not necessarily be providing the current Io to the coupled sources of the differential pair of transistors of the pre-driver (e.g., the pre-driver's load resistors may have different impedance, and the pre-driver's current supply may provide a different current). Furthermore, it is noted that this typical use of a CML buffer for the pre-driver within the prior art CML output driver 200 introduces a relatively power consumptive component therein.

Typically, a 50Ω termination is used, and the prior art CML output driver 200 is externally AC coupled through a capacitor (two capacitors for differential signaling) and another 50Ω resistor. The power consumption of such a prior art CML output driver 200 is a function of the required output swing and does not scale with the advancement of process technology employed to manufacture integrated circuits. As a result, output driver power consumption is becoming a larger percentage of the total power of the integrated circuit. In addition, as the power supply voltage within various communication devices shrinks with newer processes (e.g., newer processes often try to operate using a lower power supply voltage), the return loss of such a prior art CML output driver 200 degrades. In addition, meeting the stringent S11 specifications becomes more and more difficult.

The prior art CML output driver 200 of this diagram provides a differential peak to peak swing equal to 50Ω×Io, where Io is the current provided from the current source coupled to the source-coupled node of the differential pair of transistors. In addition, due to AC coupling (provided by the two capacitors), the output high levels of the prior art CML output driver 200 are only VDD−12.5×Io (instead of VDD); The output lower levels of the prior art CML output driver 200 are VDD−37.5×Io (instead of VDD) [which corresponds to a differential peak to peak swing equal to 50Ω×Io].

This voltage drop pushes the differential pair of transistors out of the saturation region. To overcome this issue, structures such as common mode lifting blocks may be connected to the output nodes (e.g., those nodes of the drains of the differential pair of transistors that provide output signal outp/outn or AC coupled output signal outp'/outn'). The addition of such blocks (e.g., common mode lifting blocks), however, introduces more capacitance that not only slows down the operation of the prior art CML output driver 200 but also degrades return loss performance thereof (e.g., hurts the reflection coefficient, S11, that corresponds to power reflected from imperfections within such an electrical, or optical, system).

Considering FIG. 2, the on-chip DC voltages provided by the prior art CML output driver 200 are as follows:

VDC=VDD−((50Ω−Io)/2), where the second term ((50Ω−Io)/2) is the voltage drop across each 50Ω resistor.

As the power supply voltages of many communication devices continues to go down (e.g., in many handheld devices, or generally devices where reduction in energy/power consumption is sought), this reduction in voltage can push the differential pair of transistors employed in the prior art CML output driver 200 out of saturation. This can cause significant problems in operation, in that, the differential pair of transistors is now operating in (or close to operating in) its linear region. The gain consequently reduces, and a larger signal is then needed to turn the component on/off. Moreover, because the input signals provided in such a prior art CML output driver 200 are analog in nature, they generally consume a large amount of power, which is of course undesirable for devices in which a reduction of energy/power consumption is sought.

There continues to be a need in the art for better means of implemented output driver related technology, including addressing the need for lower power consumption within such output driver related technology.

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

DETAILED DESCRIPTION OF THE INVENTION

A novel approach to implementing an output driver is presented herein. This novel approach, when compared to prior art approaches, has the ability to reduce the power consumption by one-half. This novel approach also improves return loss, and it can be easily modified to accommodate de-emphasis (including dual-sided de-emphasis).

Figure 1:
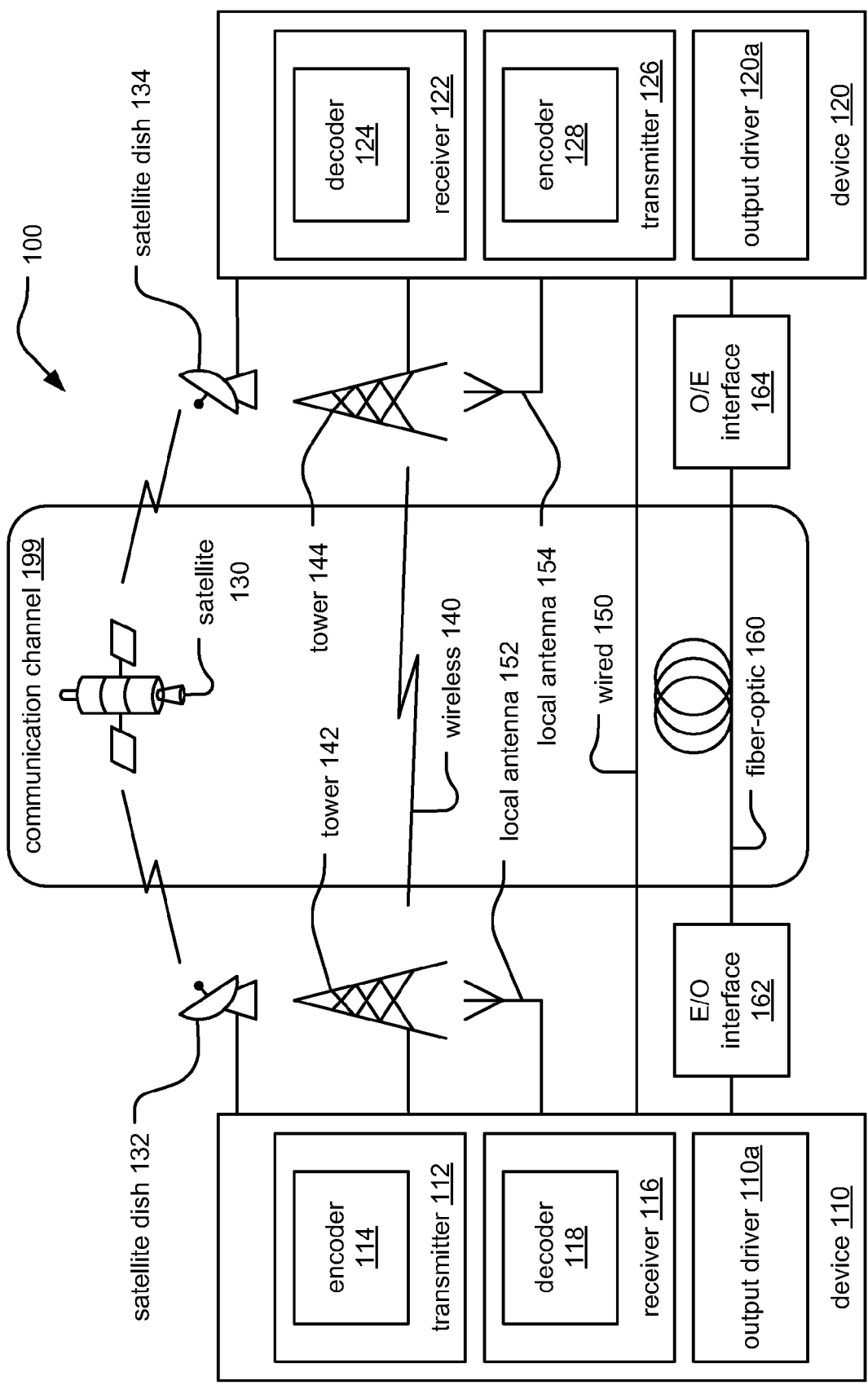
FIG. 1 illustrates an embodiment of a communication system.

The goal of digital communications systems is to transmit digital data from one location, or subsystem, to another either error free or with an acceptably low error rate. As shown in FIG. 1, data may be transmitted over a variety of communications channels in a wide variety of communication systems: magnetic media, wired, wireless, fiber (e.g., optical fiber), copper, and/or other types of media as well.

FIG. 1 is a diagram illustrating an embodiment of a communication system 100.

Referring to FIG. 1, this embodiment of a communication system 100 is a communication channel 199 that communicatively couples a communication device 110 (including a transmitter 112 having an encoder 114 and including a receiver 116 having a decoder 118) situated at one end of the communication channel 199 to another communication device 120 (including a transmitter 126 having an encoder 128 and including a receiver 122 having a decoder 124) at the other end of the communication channel 199. In some embodiments, either of the communication devices 110 and 120 may only include a transmitter or a receiver. There are several different types of media by which the communication channel 199 may be implemented (e.g., a satellite communication channel 130 using satellite dishes 132 and 134, a wireless communication channel 140 using towers 142 and 144 and/or local antennae 152 and 154, a wired communication channel 150, and/or a fiber-optic communication channel 160 using electrical to optical (E/O) interface 162 and optical to electrical (O/E) interface 164)). In addition, more than one type of media may be implemented and interfaced together thereby forming the communication channel 199.

In addition, more than one type of media may be implemented and interfaced together thereby forming the communication channel 199. It is noted also that either one of both of the communication device 110 and the communication device 120 can include a hard disk drive (HDD) (or be coupled to a HDD).

Moreover, either one of both of the communication device 110 and the communication device 120 can include an output driver in accordance with any of the embodiments and/or aspects described herein. For example, the communication device 110 can include an output driver 110a, and the communication device 120 can include an output driver 120a.

The signals employed within this embodiment of a communication system 100 can be of any variety of types of signals, including uncoded signals, Reed-Solomon (RS) coded signals, LDPC (Low Density Parity Check) coded signal, turbo coded signals, turbo trellis coded modulation (TTCM), or coded signal generated using some other error correction coding (ECC).

Also, any of a very wide variety of applications that perform transferring of signals from one location to another (e.g., including from a first location to a HDD, or from the HDD to another location) can benefit from various aspects of the invention, including any of those types of communication devices and/or communication systems depicted in FIG. 1. Moreover, any other types of devices, methods, and applications that employ an output driver can also benefit from various aspects of the invention.

Figure 2:
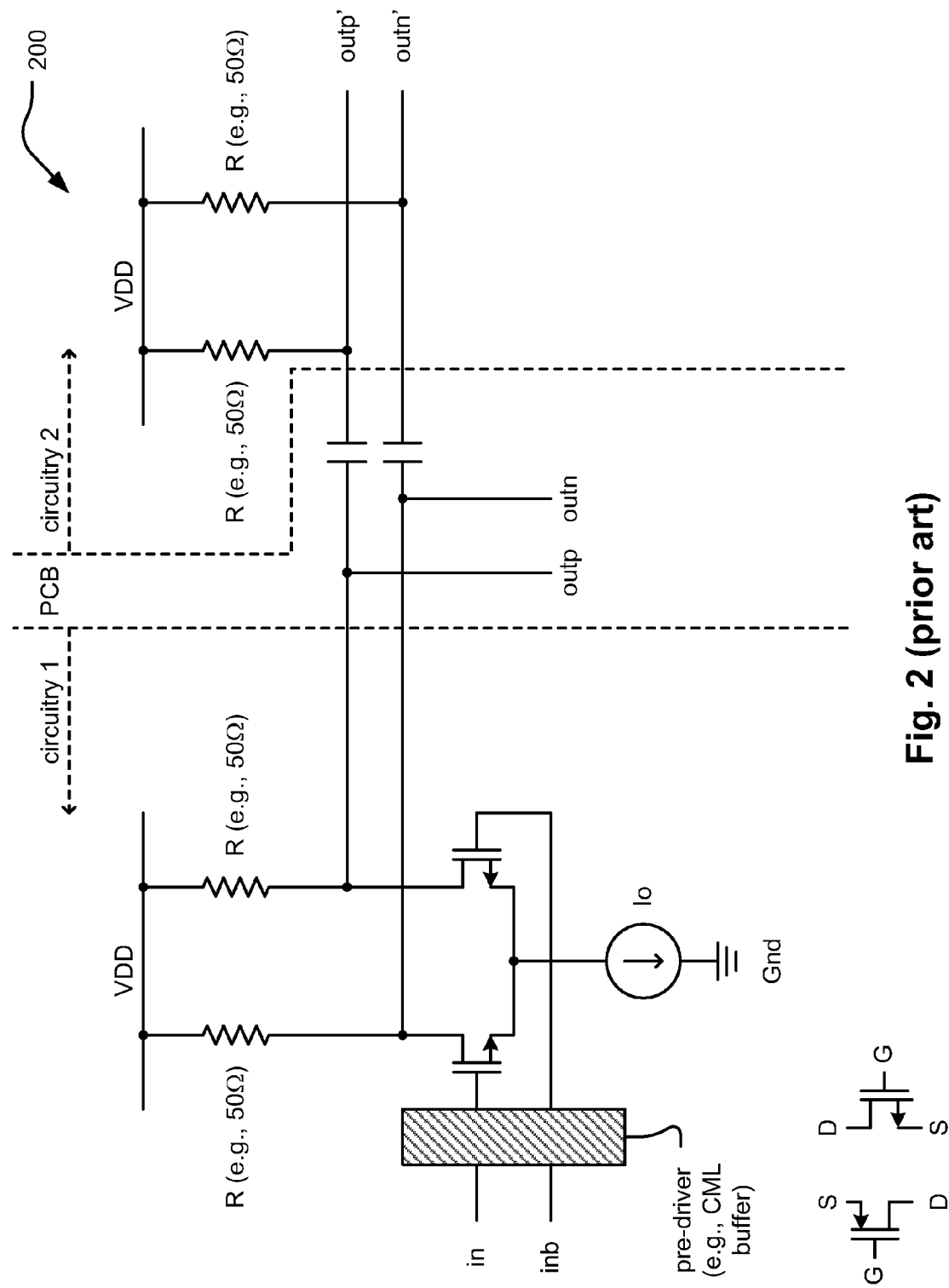
FIG. 2 illustrates an embodiment of a prior art common mode logic (CML) output driver.

For more detailed description of the prior art embodiment of FIG. 2, the reader is directed to the "DESCRIPTION OF RELATED ART" section herein.

FIG. 2 illustrates an embodiment of a prior art common mode logic (CML) output driver 200.

As described above, within many communication systems, there are often interfaces between communication devices, integrated circuits, boards, and/or other elements therein. Sometimes, a last element (e.g., in an integrated circuit) that outputs a signal to be transmitted to another element (e.g., to another integrated circuit via a printed circuit board) is referred to as an output driver. Sometimes, such output drivers need to deliver slightly more current than other elements within the integrated circuit (such as those that only communicate between various elements within the integrated circuit).

Generally speaking, interfaces between various elements (e.g., an interface between an integrated circuit and a trace on a printed circuit board, an interface between two integrated circuits, etc.) employ the use of an output driver. Any embodiment of an output driver constructed in accordance with the aspects presented herein can be employed within a wide variety of applications. It is noted that many such possible applications including the use of such an embodiment of an output driver to process a signal being output via some interface leading to another element or component.

Figure 3:
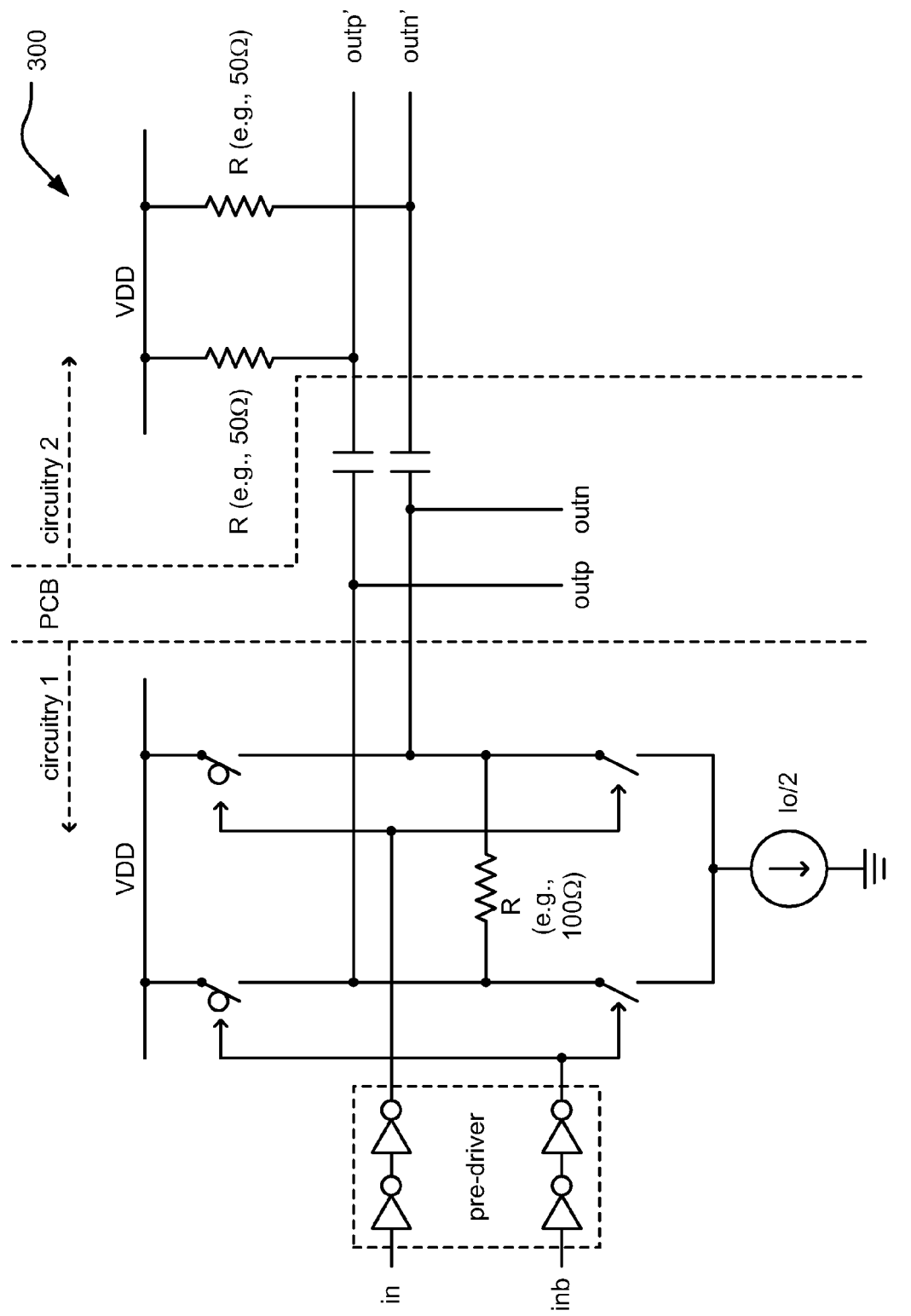
FIG. 3 illustrates an embodiment of an output driver.

FIG. 3 illustrates an embodiment of an output driver 300. This embodiment shows one possible implementation of a low power approach where the CML differential pairs of transistors (e.g., of the prior art CML output driver 200 of FIG. 2) are replaced with switches. By using switches as opposed to differential pairs of transistors, many of the undesirable aspects of employing differential pairs of transistors (e.g., as described above with reference to the prior art CML output driver 200) are entirely overcome within the output driver 300. As one example, the output driver 300 can operate on an incoming digital signal (e.g., rail to rail), and as such lose all of the deleterious effects associated with using an analog input signal (e.g., high power consumption, etc.). Many of the diagrams depicted herein show switches employed therein.

These switches can be implemented using complementary metal-oxide-semiconductor (CMOS) technology. Moreover, these switches can also be implemented using n-channel field effect transistors (N-FETs), p-channel field effect transistors (P-FETs), transfer gates, n-channel metal oxide semiconductor field-effect transistor (N-MOSFET) based switches, and/or p-channel metal oxide semiconductor field-effect transistor (P-MOSFET) based switches without departing from the scope and spirit of the invention. Generally speaking, any desired switching technology may be employed in any of the embodiments depicted herein without departing from the scope and spirit of the invention.

Looking at the differential input signal, in/inb, provided to the output driver 300, it is seen that a pre-driver of this novel embodiment is composed of four inverters as compared to the typical use of a CML buffer type pre-driver within the prior art embodiment of FIG. 2. Given that the output driver 300 can operate on an incoming digital signal, a much less complex pre-driver can be employed in the output driver 300 when compared to the prior art embodiment of FIG. 2. Moreover, the use of simple inverters in the pre-driver is much less power consumptive than using the CML buffer type pre-driver used within the prior art embodiment of FIG. 2.

Using this novel structure, even though only a maximum current of Io/2 is required in the output driver 300 of FIG. 3, a comparable output voltage swing of 50Ω×Io (which was provided in FIG. 2) can be achieved in the output driver 300 of FIG. 3 by passing the current of Io/2 through a 100Ω resistor (e.g., 50Ω×Io=100Ω×Io/2) (e.g., same voltage swing as within the prior art CML output driver 200 of FIG. 2). The reader is reminded that Io is the current employed in the prior art embodiment of FIG. 2. Therefore, only one-half of the current required in the prior art CML output driver 200 of FIG. 2 need be provided from the current supply of the output driver 300 of FIG. 3 that couples to the switches (of FIG. 3) that have replaced the CML differential pairs of transistors (of FIG. 2). In addition, the high level of this output driver 300 is now truly VDD [e.g., as opposed to VDC=VDD−((50Ω−Io)/2) as described with reference to FIG. 2]. As such, there is no need for the addition of a common mode lifting structure as may be needed in the prior art CML output driver 200 of FIG. 2. Moreover, the return loss performance of this output driver 300 is also improved when compared to the prior art CML output driver 200 of FIG. 2.

From certain perspectives, it can be seen that there is a reduction in the total amount of current required within the output driver 300 of FIG. 3 when compared to the prior art CML output driver 200 of FIG. 2. In addition, by employing buffers within the output driver 300 of FIG. 3 instead of the CML circuitry in the prior art CML output driver 200 of FIG. 2 (e.g., differential pairs of transistors), there is considerable power savings within the output driver 300 of FIG. 3.

The output driver 300 includes an input implemented to receive a differential input signal that may be viewed as being composed of a first input signal (in) and a second input signal (inb). A switching array includes first and second switches as well as first and second inverting switches as depicted in the diagram. A current source is coupled between ground and a node that couples a first end of the first switch and a first end of the second switch. A resistor (e.g., shown as having a 100Ω impedance) is coupled between a second end of the first switch and a second end of the second switch as depicted in the diagram.

If can be seen that, depending on the connectedness of the switching array, current will either flow through the resistor from left to right in one connectedness or flow through the resistor from right to left in another connectedness. An output signal is selected from the nodes of the resistor (shown as outp/outn) or as an AC coupled output signal (shown as outp'/outn').

If desired, the output driver 300 may be externally AC coupled through a capacitor (two capacitors for differential signaling) and another 50Ω resistor.

As depicted in the diagram, the output driver 300 can be implemented in a circuitry 1 and coupled to a circuitry 2 such that each of the circuitry 1 and the circuitry 2 are implemented on a printed circuit board (PCB). For example, circuitry 1 and circuitry 2 could each be implemented as separate integrated circuits. The bounds shown as defining the circuitry 1 and the circuitry 2 are shown for this particular embodiment, but it is noted that some of the components may be moved or placed in different locations in alternative embodiments. For example, all of the components in FIG. 3 could be implemented in a single integrated circuit in a particular embodiment, or the AC coupling capacitors could be implemented in the circuitry 1 in another embodiment, etc.

Figure 4:
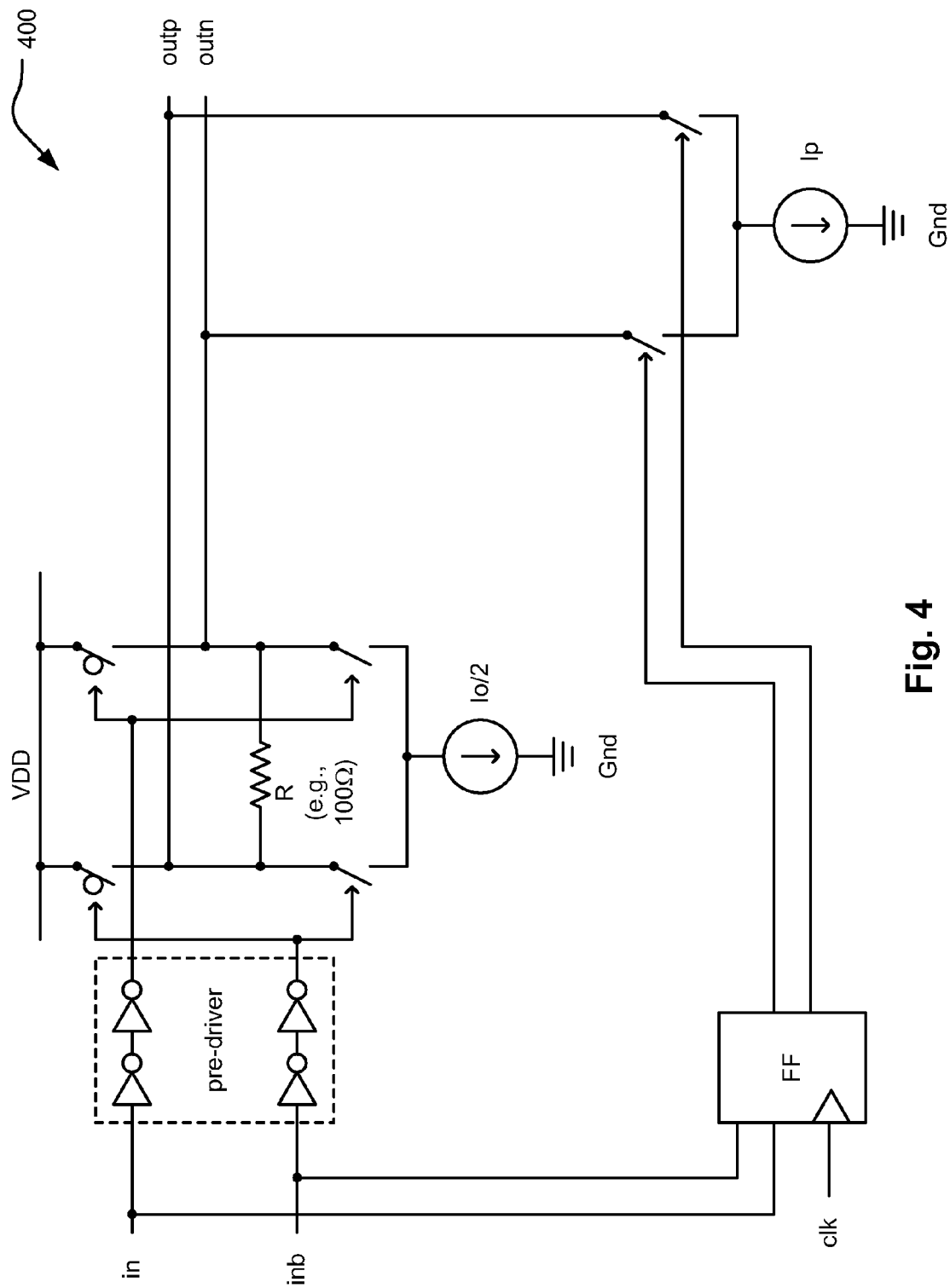
FIG. 4 illustrates an embodiment of an output driver with one tap de-emphasis.

FIG. 4 illustrates an embodiment of an output driver 400 with one tap de-emphasis. This output driver 400 is a variant of or alternative embodiment that builds on the output driver 300 of the previous embodiment. This diagram shows how the output driver 300 can be modified if de-emphasis is required or desired. In one embodiment, de-emphasis may be viewed as employing finite impulse response (FIR) filtering on information (e.g., 1s and 0s) to be transmitted. Generally, this can be viewed as performing pre-distortion to a signal (e.g., often including boosting in the relatively higher frequency range of the signal), so that the effects of the communication channel across which the signal is transmitted are compensated for (e.g., the pre-distorted signal, after having passed through the communication channel, will have the desired form at the receiving end of the communication channel). Single tap FIR filtering may be viewed as delaying a signal by 1 cycle (e.g., duration T), and then subtracting that signal from itself. This subtraction can be implemented by switching the polarity of the delayed signal and added that polarity-switched/delayed signal to itself. This generally results in a boost of the high frequency content of the signal (e.g., see FIG. 5 where there is peaking at the higher frequency region just after the upward transition).

In this diagram, a current source providing the current Ip represents the required de-emphasis current. Moreover, additional taps can be easily added using the similar concept. To add an additional tap, only a corresponding current source and two corresponding switches are needed. Generally speaking, a corresponding current source and two corresponding switches are needed for each additional tap to be added in accordance with de-emphasis.

Considering the upper left hand side of the diagram, it can be seen that the circuitry thereof is very similar to previous embodiment. However, the input signal is also provided to a flip-flop (FF) that is clocked using a signal, clk. The output of the FF governs the switches coupled near the current source that provides the current Ip (i.e., the required de-emphasis current).

Figure 5:
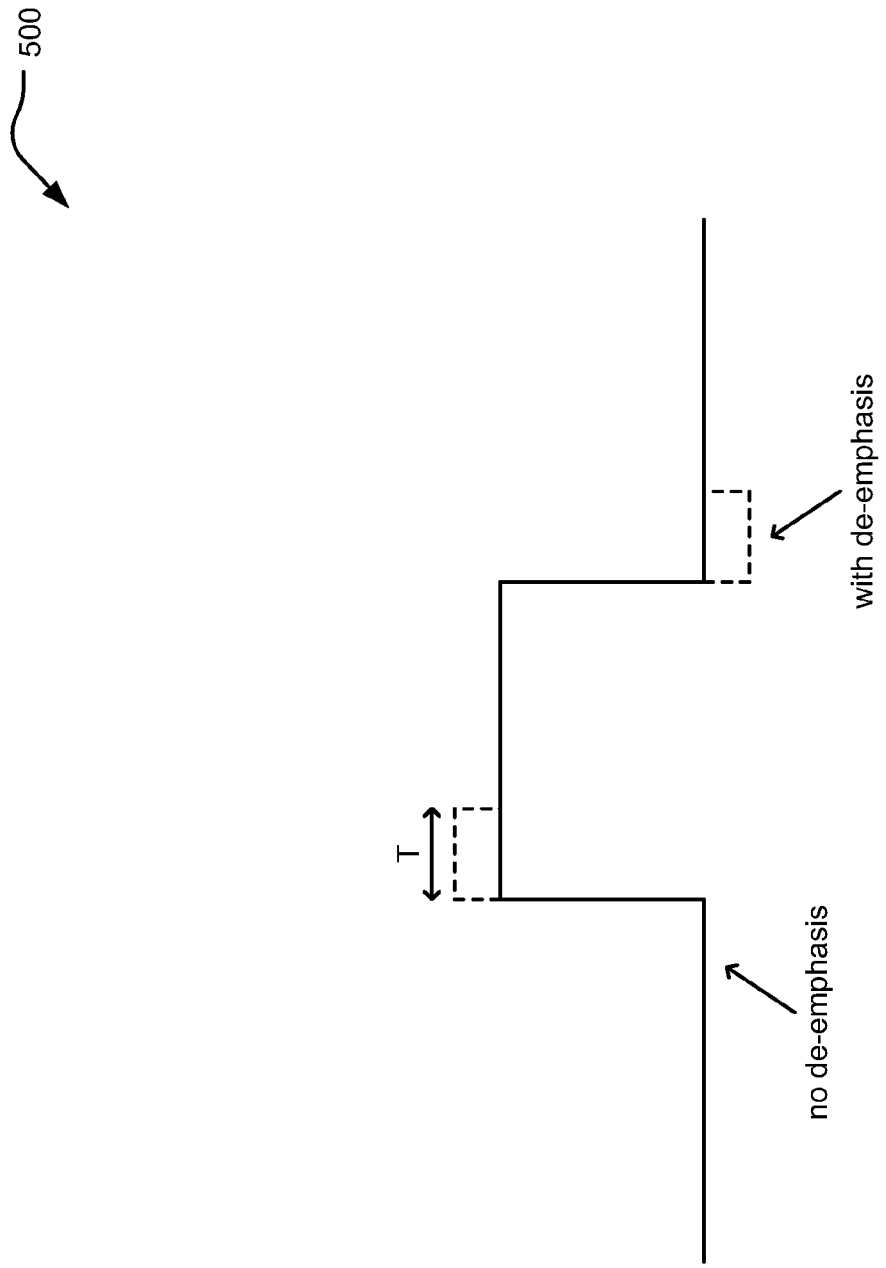
FIG. 5 illustrates an embodiment of an output signal with and without de-emphasis.

FIG. 5 illustrates an embodiment of an output signal with and without de-emphasis 500. This diagram shows the obtained output signal and its swing achieved using the output driver 400 of the previous embodiment. In this diagram, T represents the time unit interval.

Figure 6:
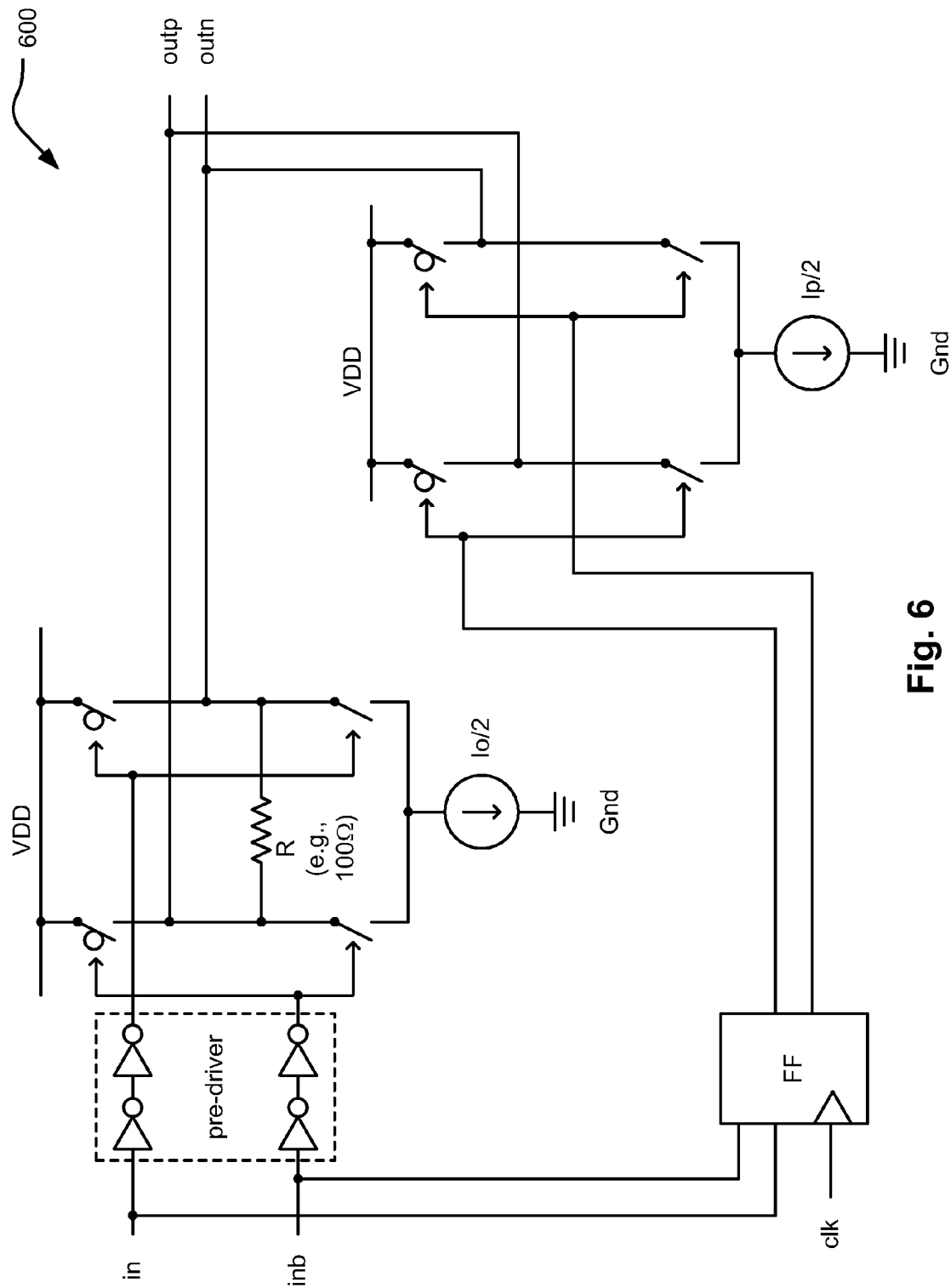
FIG. 6 illustrates an embodiment of an output driver with dual-sided, one tap de-emphasis.

FIG. 6 illustrates an embodiment of an output driver 600 with dual-sided, one tap de-emphasis. This output driver 600 also is a variant of or alternative embodiment that builds on the output driver 300 of one of the previous embodiment. This diagram shows how the output driver 300 can be modified if dual-sided de-emphasis is required or desired. In this diagram, a current source providing the current Ip/2 is employed (where Ip represents the required de-emphasis current when compared to the previous embodiment of the output driver 400 of FIG. 4).

Considering the upper left hand side of the diagram, it can be seen that the circuitry thereof is very similar to previous embodiment of the output driver 300 of the FIG. 3. However, the input signal is also provided to a flip-flop (FF) that is clocked using a signal, clk. The output of the FF governs a switch array (in the lower right hand side of the diagram) implemented somewhat analogously with switch array in the upper left hand side of the diagram or the output driver 300 of the FIG. 3. However, the switch array in the lower right hand side of the diagram includes no resistor coupled between the output nodes.

Moreover, additional taps can be easily added using the similar concept. To add an additional tap, only a corresponding current source and two corresponding switches are needed. Generally speaking, a corresponding current source and two corresponding switches are needed for each additional tap to be added in accordance with de-emphasis.

As can be seen in this diagram, a de-emphasis implementation can be modified to cut the required de-emphasis current by half as shown in this diagram (e.g., consider the differences between the current supplies in the lower right hand sides of the FIG. 4 and the FIG. 6 that provide currents Ip and Ip/2, respectively). Only two additional switches are required to enable this power savings.

Figure 7:
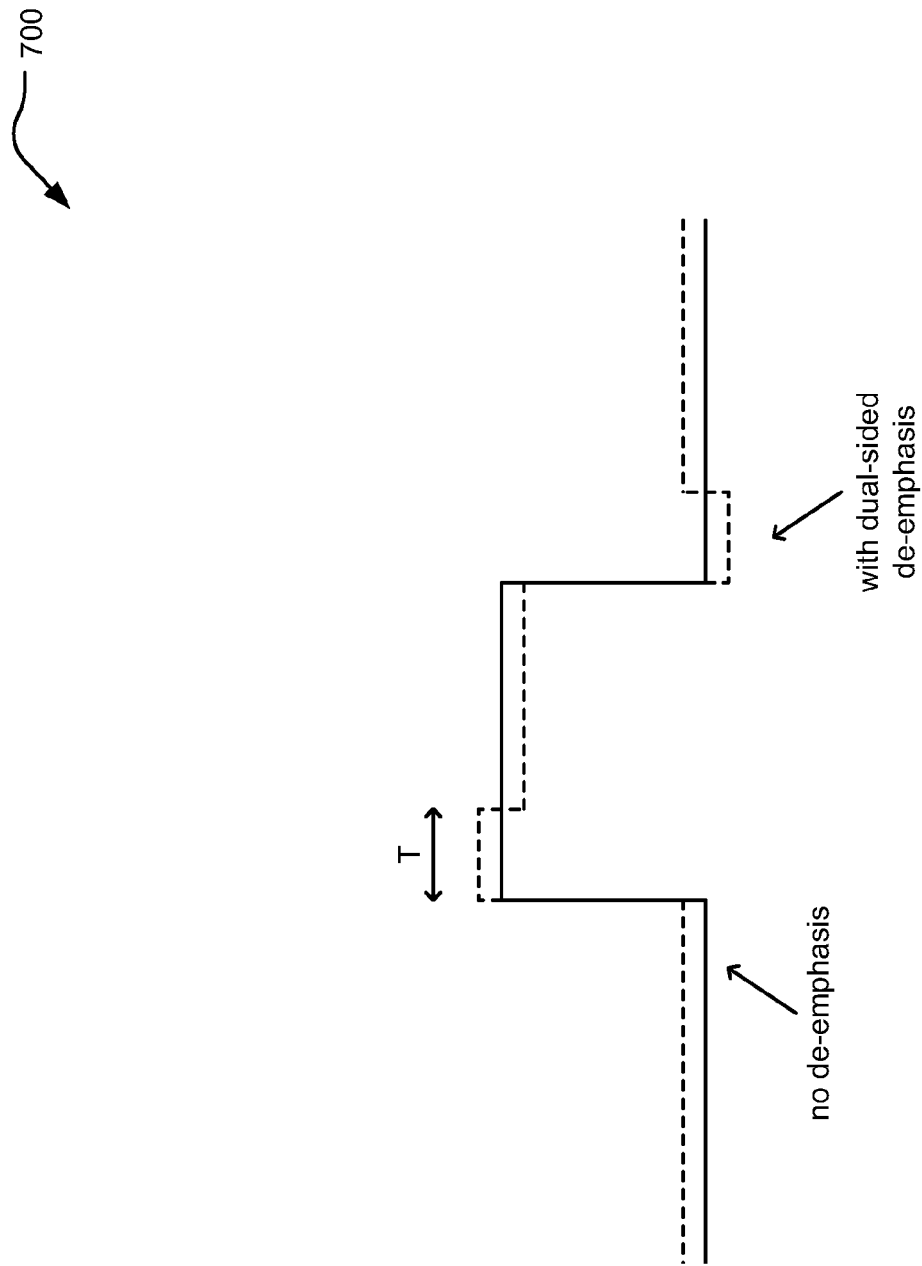
FIG. 7 illustrates an embodiment of an output signal with and without dual-sided de-emphasis.

FIG. 7 illustrates an embodiment of an output signal with and without dual-sided de-emphasis 700. This diagram shows the obtained output signal and its swing achieved using the output driver 600 of the previous embodiment. In this diagram, T represents the time unit interval. As can be seen, there is a portion of the output signal that has lost some of its swing (e.g., when compared to the embodiment of FIG. 5), but the amount of pre-emphasis is the same. The ratio of where there is a peak in the signal to where the output signal doesn't have a peak is the same as when compared to the embodiment of the output driver 400 of FIG. 4 whose output signal is shown in FIG. 5, but it can be achieved by reducing the required de-emphasis current by a factor of one-half (e.g., using the output driver 600 of FIG. 6 whose output signal is shown in FIG. 7).

Figure 8:
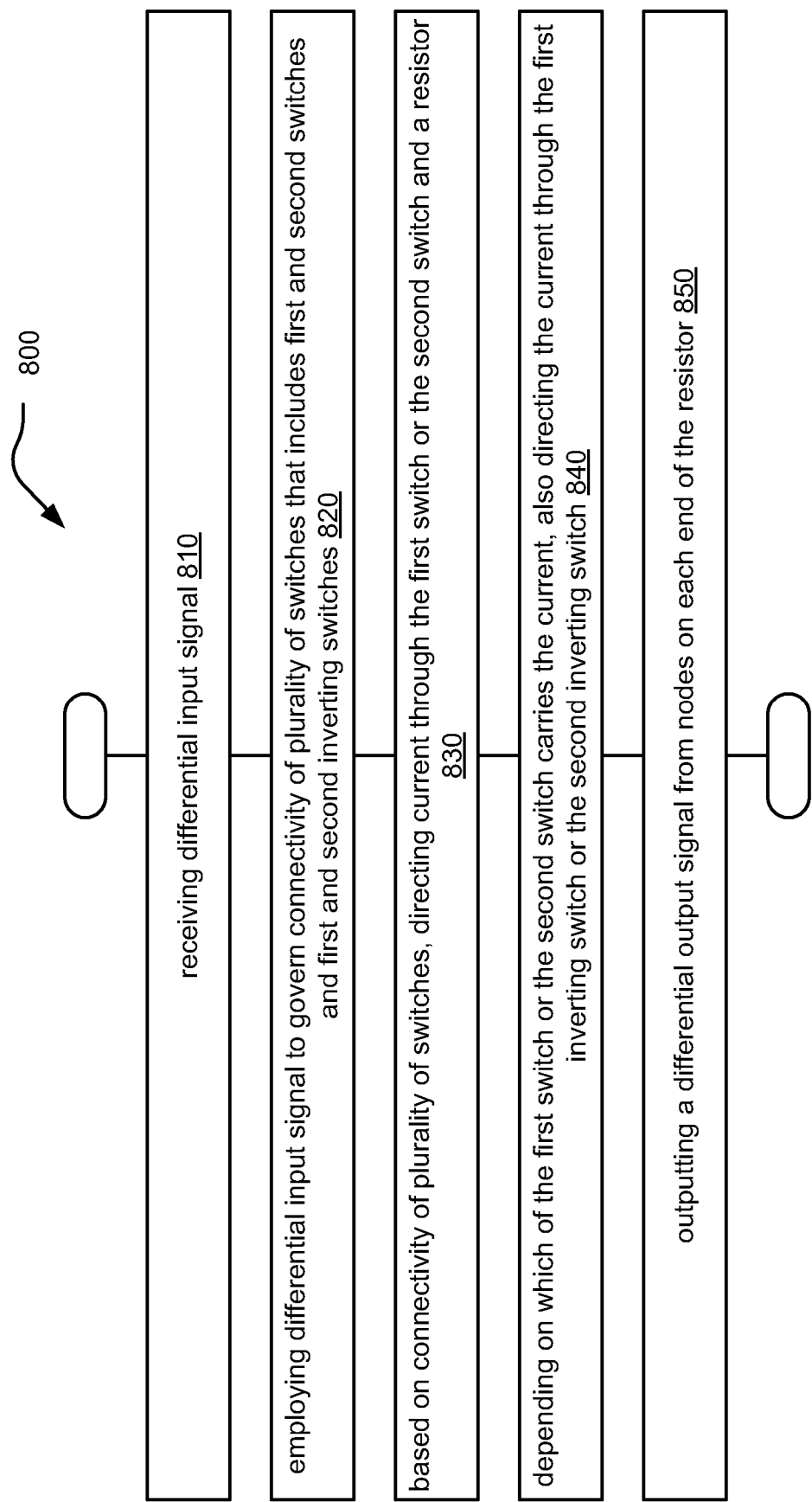
FIG. 8 illustrates an embodiment of a method for generating an output signal.

FIG. 8 illustrates an embodiment of a method 800 for generating an output signal. The method 800 begins by receiving differential input signal, as shown in a block 810.

The method 800 continues by employing the differential input signal to govern the connectivity of plurality of switches that includes first and second switches and first and second inverting switches, as shown in a block 820. The method 800 continues by based on connectivity of plurality of switches, directing current through the first switch or the second switch and a resistor, as shown in a block 830.

The method 800 continues by depending on which of the first switch or the second switch carries the current, also directing the current through the first inverting switch or the second inverting switch, as shown in a block 840. The method 800 continues by outputting a differential output signal from nodes on each end of the resistor, as shown in a block 850.

It is also noted that the de-emphasis (including dual-sided de-emphasis) can be employed using pre-cursors and/or post-cursors. Also, the number of taps employed within a given embodiment may be varied as well. If desired, the particular power supply to which a current source is connected may be VDD (as opposed to VSS) without departing from the scope and spirit of the invention.

It is noted that the various modules (e.g., encoders, decoder, output drivers, etc.) described herein may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The operational instructions may be stored in a memory. The memory may be a single memory device or a plurality of memory devices. Such a memory device may be a read-only memory, random access memory, volatile memory, non-volatile memory, static memory, dynamic memory, flash memory, and/or any device that stores digital information. It is also noted that when the processing module implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. In such an embodiment, a memory stores, and a processing module coupled thereto executes, operational instructions corresponding to at least some of the steps and/or functions illustrated and/or described herein.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention.

One of average skill in the art will also recognize that the functional building blocks, and other illustrative blocks, modules and components herein, can be implemented as illustrated or by discrete components, application specific integrated circuits, processors executing appropriate software and the like or any combination thereof.

Moreover, although described in detail for purposes of clarity and understanding by way of the aforementioned embodiments, the present invention is not limited to such embodiments. It will be obvious to one of average skill in the art that various changes and modifications may be practiced within the spirit and scope of the invention, as limited only by the scope of the appended claims.

What is claimed is:
1. An apparatus, comprising:
an input implemented to receive a differential input signal that includes a first input signal and a second input signal;
first and second switches;
first and second inverting switches;
a constant current source such that a first end of the constant current source is grounded and a second end of the constant current source directly connects to a first end of the first switch and a first end of the second switch;
a resistor that directly connects between a second end of the first switch and a second end of the second switch; and
an output implemented to output a differential output signal that includes a first output signal and a second output signal; and wherein:
the first input signal is provided to the second inverting switch and the second switch such that the first input signal ensures that the second inverting switch is closed when the second switch is open;
the second input signal is provided to the first inverting switch and the first switch such that the second input signal ensures that the first inverting switch is closed when the first switch is open;
a first end of the first inverting switch directly connects to a power supply and a second end of the first inverting switch directly connects to the second end of the first switch; a first end of the second inverting switch directly connects to the power supply and a second end of the second inverting switch directly connects to the second end of the second switch the first output signal, having a respective high voltage level being that of the power supply, is output from a first end of the resistor; and the second output signal, having a respective high voltage level being that of the power supply, is output from a second end of the resistor.

2. The apparatus of claim 1, further comprising:
a first inverter, directly connected to the second inverting switch and the second switch, that inverts the first input signal before the first input signal is provided to the second inverting switch and the second switch; and
a second inverter, directly connected to the first inverting switch and the first switch, that inverts the second input signal before the second input signal is provided to the first inverting switch and the first switch.

3. The apparatus of claim 1, wherein:
the resistor is a 100Ω resistor.

4. The apparatus of claim 1, further comprising:
a first capacitor that is coupled to the second end of the first switch; and
a second capacitor that is coupled to the second end of the second switch.

5. The apparatus of claim 1, wherein:
the resistor is a first resistor; and further comprising:
a first capacitor that is coupled to the second end of the first switch;
a second capacitor that is coupled to the second end of the second switch;
a second resistor coupled between the first capacitor and the power supply; and
a third resistor coupled between the second capacitor and the power supply.

6. The apparatus of claim 1, wherein:
the resistor is a first resistor;
the apparatus is a first integrated circuit;
the first integrated circuit is coupled to a second integrated circuit that includes:
a first capacitor that is coupled to the second end of the first switch;
a second capacitor that is coupled to the second end of the second switch;
a second resistor coupled between the first capacitor and the power supply; and
a third resistor coupled between the second capacitor and the power supply.

7. The apparatus of claim 6, wherein:
the second resistor has an impedance of 50Ω; and
the third resistor has an impedance of 50Ω.

8. The apparatus of claim 1, further comprising:
a first inverter, directly connected to the second inverting switch and the second switch, that inverts the first signal before the first signal is provided to the second inverting switch and the second switch;
a second inverter, directly connected to the first inverting switch and the first switch, that inverts the second signal before the second signal is provided to the first inverting switch and the first switch;
a flip-flop having two inputs that are coupled to inputs of the first inverter and the second inverter, respectively;
third and fourth switches that are respectively governed by two outputs of the flip-flop;
at least one additional constant current source such that a first end of the at least one additional constant current source is grounded and a second end of the at least one additional constant current source directly connects to a first end of the third switch and a first end of the fourth switch; and wherein:
a second end of the third switch is coupled to the second end of the first switch; and
a second end of the fourth switch is coupled to the second end of the second switch.

9. The apparatus of claim 1, further comprising:
a first inverter, directly connected to the second inverting switch and the second switch, that inverts the first signal before the first signal is provided to the second inverting switch and the second switch;
a second inverter, directly connected to the first inverting switch and the first switch, that inverts the second signal before the second signal is provided to the first inverting switch and the first switch;
a flip-flop having two inputs that are coupled to inputs of the first inverter and the second inverter, respectively;
third and fourth switches;
third and fourth inverting switches;
at least one additional constant current source such that a first end of the at least one additional constant current source is grounded and a second end of the at least one additional constant current source directly connects to a first end of the third switch and a first end of the fourth switch; and wherein:
a first output signal from the flip-flop is provided to the fourth inverting switch and the fourth switch such that the first output signal from the flip-flop ensures that the fourth inverting switch is closed when the fourth switch is open;
a second output signal from the flip-flop is provided to the third inverting switch and the third switch such that the second output signal from the flip-flop ensures that the third inverting switch is closed when the third switch is open;
a second end of the third switch is coupled to the second end of the first switch; and
a second end of the fourth switch is coupled to the second end of the second switch.

10. The apparatus of claim 1, wherein:
at least one of the first switch, the second switch, the first inverting switch, and
the second inverting switch is implemented using an n-channel metal oxide semiconductor field-effect transistor (N-MOSFET), a p-channel metal oxide semiconductor field-effect transistor (P-MOSFET), or a transfer gate.

11. The apparatus of claim 1, wherein:
the apparatus is a circuitry that is implemented within a communication device; and
the communication device is implemented within at least one of a satellite communication system, a wireless communication system, a wired communication system, and a fiber-optic communication system.

12. An apparatus, comprising:
a first inverter implemented to invert a first input signal of a differential input signal;
a second inverter implemented to invert a second input signal of the differential input signal;
first and second switches;
first and second inverting switches;
a constant current source such that a first end of the constant current source is grounded and a second end of the constant current source directly connects to a first end of the first switch and a first end of the second switch;

a resistor that directly connects a second end of the first switch and a second end of the second switch; and an output implemented to output a differential output signal that includes a first output signal and a second output signal; and wherein:

an output of the first inverter directly connects to the second inverting switch and the second switch such to ensure that the second inverting switch is closed when the second switch is open;

an output of the second inverter directly connects to the first inverting switch and the first switch to ensure that the first inverting switch is closed when the first switch is open;

the first output signal, having a respective high voltage level being that of a power supply, is output from a first end of the resistor;

the second output signal, having a respective high voltage level being that of the power supply, is output from a second end of the resistor;

a first end of the first inverting switch directly connects to the power supply and a second end of the first inverting switch directly connects to the second end of the first switch; and a first end of the second inverting switch directly connects to the power supply and a second end of the second inverting switch directly connects to the second end of the second switch.

13. The apparatus of claim 12, further comprising:
a flip-flop having two inputs that are coupled to inputs of the first inverter and the second inverter, respectively;
third and fourth switches that are respectively governed by two outputs of the flip-flop;
at least one additional constant current source such that a first end of the at least one additional constant current source is grounded and a second end of the at least one additional constant current source directly connects to a first end of the third switch and a first end of the fourth switch; and wherein:
at least one additional current source coupled between ground and a node that couples a first end of the third switch and a first end of the second switch; and wherein:
a second end of the third switch is coupled to the second end of the first switch; and
a second end of the fourth switch is coupled to the second end of the second switch.

14. The apparatus of claim 12, further comprising:
a flip-flop having two inputs that are coupled to inputs of the first inverter and the second inverter, respectively;
third and fourth switches;
third and fourth inverting switches;
at least one additional constant current source such that a first end of the at least one additional constant current source is grounded and a second end of the at least one additional constant current source directly connects to a first end of the third switch and a first end of the fourth switch; and wherein:
a first output signal from the flip-flop is provided to the fourth inverting switch and the fourth switch such that the first output signal from the flip-flop ensures that the fourth inverting switch is closed when the fourth switch is open;
a second output signal from the flip-flop is provided to the third inverting switch and the third switch such that the second output signal from the flip-flop ensures that the third inverting switch is closed when the third switch is open;
a second end of the third switch is coupled to the second end of the first switch; and a second end of the fourth switch is coupled to the second end of the second switch.

15. The apparatus of claim 12, wherein:
at least one of the first switch, the second switch, the first inverting switch, and the second inverting switch is implemented using an n-channel metal oxide semiconductor field-effect transistor (N-MOSFET), a p-channel metal oxide semiconductor field-effect transistor (P-MOSFET), or a transfer gate.

16. The apparatus of claim 12, wherein:
the apparatus is a circuitry that is implemented within a communication device; and
the communication device is implemented within at least one of a satellite communication system, a wireless communication system, a wired communication system, and a fiber-optic communication system.

17. An apparatus, comprising:
a first inverter implemented to invert a first input signal of a differential input signal;
a second inverter implemented to invert a second input signal of the differential input signal;
a flip-flop having two inputs that are coupled to inputs of the first inverter and the second inverter, respectively;
first and second switches;
first and second inverting switches;
third and fourth switches that are respectively governed by two outputs of the flip-flop;
a first constant current source such that a first end of the first constant current source is grounded and a second end of the first constant current source directly connects to a first end of the first switch and a first end of the second switch;
a second constant current source such that a first end of the second constant current source is grounded and a second end of the second constant current source directly connects to a first end of the third switch and a first end of the fourth switch;
a resistor that directly connects between a second end of the first switch and a second end of the second switch; and
an output implemented to output a differential output signal that includes a first output signal and a second output signal; and wherein:
an output of the first inverter couples to the second inverting switch and the second switch such to ensure that the second inverting switch is closed when the second switch is open;
an output of the second inverter couples to the first inverting switch and the first switch to ensure that the first inverting switch is closed when the first switch is open;
the first output signal, having a respective high voltage level being that of a power supply, is output from a first end of the resistor;
the second output signal, having a respective high voltage level being that of the power supply, is output from a second end of the resistor;
a first end of the first inverting switch directly connects to a the power supply and a second end of the first inverting switch connects to the second end of the first switch;
a first end of the second inverting switch directly connects to the power supply and a second end of the second inverting switch connects to the second end of the second switch;
a second end of the third switch is coupled to the second end of the first switch; and
a second end of the fourth switch is coupled to the second end of the second switch.

18. The apparatus of claim 17, wherein:
the resistor is a first resistor; and further comprising:
a first capacitor that is coupled to the second end of the first switch;
a second capacitor that is coupled to the second end of the second switch;
a second resistor coupled between the first capacitor and the power supply; and
a third resistor coupled between the second capacitor and the power supply.

19. The apparatus of claim 17, wherein:
at least one of the first switch, the second switch, the first inverting switch, and the second inverting switch is implemented using an n-channel metal oxide semiconductor field-effect transistor (N-MOSFET), a p-channel metal oxide semiconductor field-effect transistor (P-MOSFET), or a transfer gate.

20. The apparatus of claim 17, wherein:
the apparatus is a circuitry that is implemented within a communication device; and
the communication device is implemented within at least one of a satellite communication system, a wireless communication system, a wired communication system, and a fiber-optic communication system.

* * * * *

UNITED STATES PATENT AND TRADEMARK OFFICE
CERTIFICATE OF CORRECTION

| | | |
|---|---|---|
| PATENT NO. | : 7,956,645 B2 | Page 1 of 1 |
| APPLICATION NO. | : 12/049701 | |
| DATED | : June 7, 2011 | |
| INVENTOR(S) | : Afshin Momtaz | |

It is certified that error appears in the above-identified patent and that said Letters Patent is hereby corrected as shown below:

Col. 9, line 3, in claim 1: after "second switch" insert --;--
Col. 12, line 58, in claim 17: replace "a the" with --the--

Signed and Sealed this
Sixth Day of November, 2012

David J. Kappos
*Director of the United States Patent and Trademark Office*